(12) United States Patent
Shinozaki et al.

(10) Patent No.: US 8,016,448 B2
(45) Date of Patent: Sep. 13, 2011

(54) DISPLAY DEVICE AND LIGHT-EMITTING DEVICE

(75) Inventors: Kenji Shinozaki, Ichihara (JP); Shuji Gomi, Ichihara (JP); Masataka Yokomizo, Ichihara (JP)

(73) Assignee: Showa Denko K.K., Tokyo (JP)

( * ) Notice: Subject to any disclaimer, the term of this patent is extended or adjusted under 35 U.S.C. 154(b) by 300 days.

(21) Appl. No.: 12/199,643

(22) Filed: Aug. 27, 2008

(65) Prior Publication Data

US 2009/0059117 A1 Mar. 5, 2009

(30) Foreign Application Priority Data

Aug. 31, 2007 (JP) .................................. 2007-226093

(51) Int. Cl.
*G09F 13/04* (2006.01)
*G09F 13/08* (2006.01)

(52) U.S. Cl. ....... 362/97.3; 362/547; 362/218; 362/294; 362/97.1; 313/11; 313/598

(58) Field of Classification Search .......... 313/498–512, 313/11; 362/580, 547, 218, 294, 373, 97.1–97.4
See application file for complete search history.

(56) References Cited

U.S. PATENT DOCUMENTS

| | | | |
|---|---|---|---|
| 5,942,770 A | 8/1999 | Ishinaga et al. | |
| 6,093,940 A | 7/2000 | Ishinaga et al. | |
| 7,575,357 B2* | 8/2009 | Wu et al. ....................... | 362/613 |
| 2002/0001192 A1* | 1/2002 | Suehiro et al. ................ | 362/240 |
| 2003/0076669 A1* | 4/2003 | Itoh et al. ....................... | 362/31 |
| 2005/0141244 A1* | 6/2005 | Hamada et al. ............... | 362/612 |
| 2006/0098453 A1* | 5/2006 | Kuo ............................... | 362/609 |
| 2006/0221638 A1* | 10/2006 | Chew et al. .................... | 362/613 |
| 2006/0239034 A1* | 10/2006 | Keh et al. ....................... | 362/613 |
| 2007/0064442 A1* | 3/2007 | Yoo ................................ | 362/612 |
| 2007/0081360 A1* | 4/2007 | Bailey et al. .................. | 362/621 |
| 2007/0081361 A1* | 4/2007 | Clary ............................. | 362/624 |
| 2007/0091639 A1* | 4/2007 | Yoo ................................ | 362/612 |
| 2007/0133222 A1* | 6/2007 | Watanabe et al. ............. | 362/561 |
| 2007/0153548 A1* | 7/2007 | Hamada et al. ............... | 362/615 |
| 2007/0171623 A1* | 7/2007 | Zagar et al. ..................... | 362/29 |
| 2009/0135592 A1* | 5/2009 | Hamada ........................ | 362/231 |
| 2009/0279284 A1* | 11/2009 | Takeuchi et al. ............. | 362/97.3 |
| 2009/0316072 A1* | 12/2009 | Okumura et al. ............. | 349/64 |
| 2010/0134716 A1* | 6/2010 | Hamada ........................ | 349/62 |
| 2010/0195351 A1* | 8/2010 | Ueyama ....................... | 362/613 |

FOREIGN PATENT DOCUMENTS

JP 6-3527 A 1/1994

(Continued)

*Primary Examiner* — Nimeshkumar Patel
*Assistant Examiner* — Jose M Diaz
(74) *Attorney, Agent, or Firm* — Sughrue Mion, PLLC (57) ABSTRACT

The display device includes: a display panel that displays an image; and a backlight that is disposed on a back surface of the display panel and emits light from the back surface of the display panel. The backlight includes: an output member that outputs incoming light to the display panel; and a light source that emits light to the output member from a side of the output member. The light source includes: plural board-shaped substrates that each have a light-emitting element mounted on a surface thereof; and a wiring board that is in contact with a side surface of each of the plural board-shaped substrates to hold, in an upright position, the plural board-shaped substrates which are arranged in a line, and that is arranged so that the each light-emitting element faces the side of the output member while the wiring board is electrically connected to the plural board-shaped substrates.

6 Claims, 7 Drawing Sheets

FOREIGN PATENT DOCUMENTS

| | | |
|---|---|---|
| JP | 10-290029 A | 10/1998 |
| JP | 2003-078176 A | 3/2003 |
| JP | 2003-132719 A | 5/2003 |
| JP | 2004-146411 A | 5/2004 |
| JP | 2005-353507 A | 12/2005 |
| JP | 2006-032741 A | 2/2006 |

* cited by examiner

DISPLAY DEVICE AND LIGHT-EMITTING DEVICE

CROSS REFERENCE TO RELATED APPLICATIONS

This application is based on and claims priority under 35 USC §119 from Japanese Patent Application No. 2007-226093 filed Aug. 31, 2007.

BACKGROUND OF THE INVENTION

1. Field of the Invention

The present invention relates to a display device and a light-emitting device using light-emitting elements.

2. Description of the Related Art

Recently, display devices such as liquid crystal display devices, typified by, for example, a liquid crystal display television and a liquid crystal display monitor, have adopted a backlight system as a light source for emitting light from the back, side or the like of a display panel. Examples of the backlight system include what is called a side-light (or edge light) type in which a light source is disposed on two or one side of a light guide plate made of a transparent resin so that light incident on the light guide plate is reflected by a reflector disposed on the back surface of the light guide plate, thus illuminating the surface of a liquid crystal display panel.

A fluorescent tube such as a hot-cathode fluorescent tube or a cold-cathode fluorescent tube is generally used in such a backlight system.

On the other hand, technologies of backlight system using light-emitting diodes (LED), which are a type of light-emitting elements, as their light source, have been recently developed as a substitute for such backlight systems using the fluorescent tubes.

As a backlight system with a side-light type, which uses the light-emitting diodes, a backlight system is known in which a light source formed of plural light-emitting diodes mounted on a substrate is disposed on one side of a light guide plate (refer to Patent Document 1).

There has also been a proposal to mount a side surface of a board-shaped substrate of an LED chip component having plural LED chips mounted thereon to a printed wiring board for utilization as a light source for side-lighting (refer to Patent Document 2).

Patent Document 1: Japanese Patent Application Laid Open Publication No. 6-3527
Patent Document 2: Japanese Patent Application Laid Open Publication No. 10-290029

Incidentally, in backlight system with the side-light type, the length of the light source is determined according to the size of the liquid crystal display panel. In other words, a larger liquid crystal display panel requires a longer light source.

However, consider a case, for example, where a light source is formed by mounting a required number of light-emitting elements on a substrate, and by mounting the substrate, at the side surface thereof, on a printed wiring board. In this case, the influence of warpage occurring in the substrate having the light-emitting elements mounted thereto is not negligible as the length of the light source becomes longer. If the influence of the warpage is so great that it is not negligible, there is a likelihood that light emitted from the light-emitting elements mounted on the substrate may not be oriented in a desired direction, which leads to unevenness of light quantity in the display device.

An object of the present invention is to suppress occurrence of unevenness of light quantity when a light source is configured by mounting a side surface of a board-shaped substrate on a wiring board, the substrate having light-emitting elements mounted thereon.

SUMMARY OF THE INVENTION

According to an aspect of the present invention, there is provided a display device including: a display panel that displays an image; and a backlight that is disposed on a back surface of the display panel and emits light from the back surface of the display panel. The backlight includes: an output member that outputs incoming light to the display panel; and a light source that emits light to the output member from a side of the output member. The light source includes: a plurality of board-shaped substrates that each have a light-emitting element mounted on a surface thereof; and a wiring board that is in contact with a side surface of each of the plurality of board-shaped substrates to hold, in an upright position, the plurality of board-shaped substrates which are arranged in a line, and that is arranged so that the each light-emitting element faces the side of the output member while the wiring board is electrically connected to the plurality of board-shaped substrates.

In such a display device, each of the board-shaped substrates has the side surface that is in contact with the wiring board, and other side surfaces that are not in contact with the wiring board, and the side surface is flatter than the other side surfaces. Further, each of the board-shaped substrates has a plurality of the light-emitting elements mounted thereon, and the plurality of light-emitting elements have corresponding lenses formed respectively thereon. Furthermore, a plurality of electrodes that electrically connect each of the plurality of board-shaped substrates to the wiring board are formed in a row on a back surface of each of the plurality of board-shaped substrate, and a width of each of two electrodes disposed on both ends among the plurality of electrodes is greater than a width of each of the plurality of electrodes other than the two electrodes. Furthermore, the plurality of board-shaped substrates are thermally connected to the wiring board.

According to another aspect of the present invention, there is provided a light-emitting device including: a plurality of board-shaped substrates that each have a light-emitting element mounted on a surface thereof; and a wiring board that is in contact with a side surface of each of the plurality of board-shaped substrates to hold, in an upright position, the plurality of board-shaped substrates which are arranged in a line, and that is arranged so that the each light-emitting element is directed toward a side while the wiring board is electrically connected to the plurality of board-shaped substrates.

In such a light-emitting device, each of the plurality of board-shaped substrates has a red light emitting element, a green light emitting element and a blue light emitting element mounted thereon as the light-emitting element. Further, the plurality of board-shaped substrates are thermally connected to the wiring board, and the wiring board has a radiator formed therein to radiate heat transferred from the plurality of board-shaped substrates.

According to the present invention, it is possible to suppress occurrence of unevenness of light quantity when a light source is configured by mounting a side surface of a board-shaped substrate on a wiring board, the substrate having light-emitting elements mounted thereon.

BRIEF DESCRIPTION OF THE DRAWINGS

Exemplary embodiment(s) of the present invention will be described in detail based on the following figures, wherein.

DETAILED DESCRIPTION OF THE EMBODIMENTS

Hereinafter, an exemplary embodiment of the present invention will be described in detail with reference to the accompanying drawings.

Figure 1:
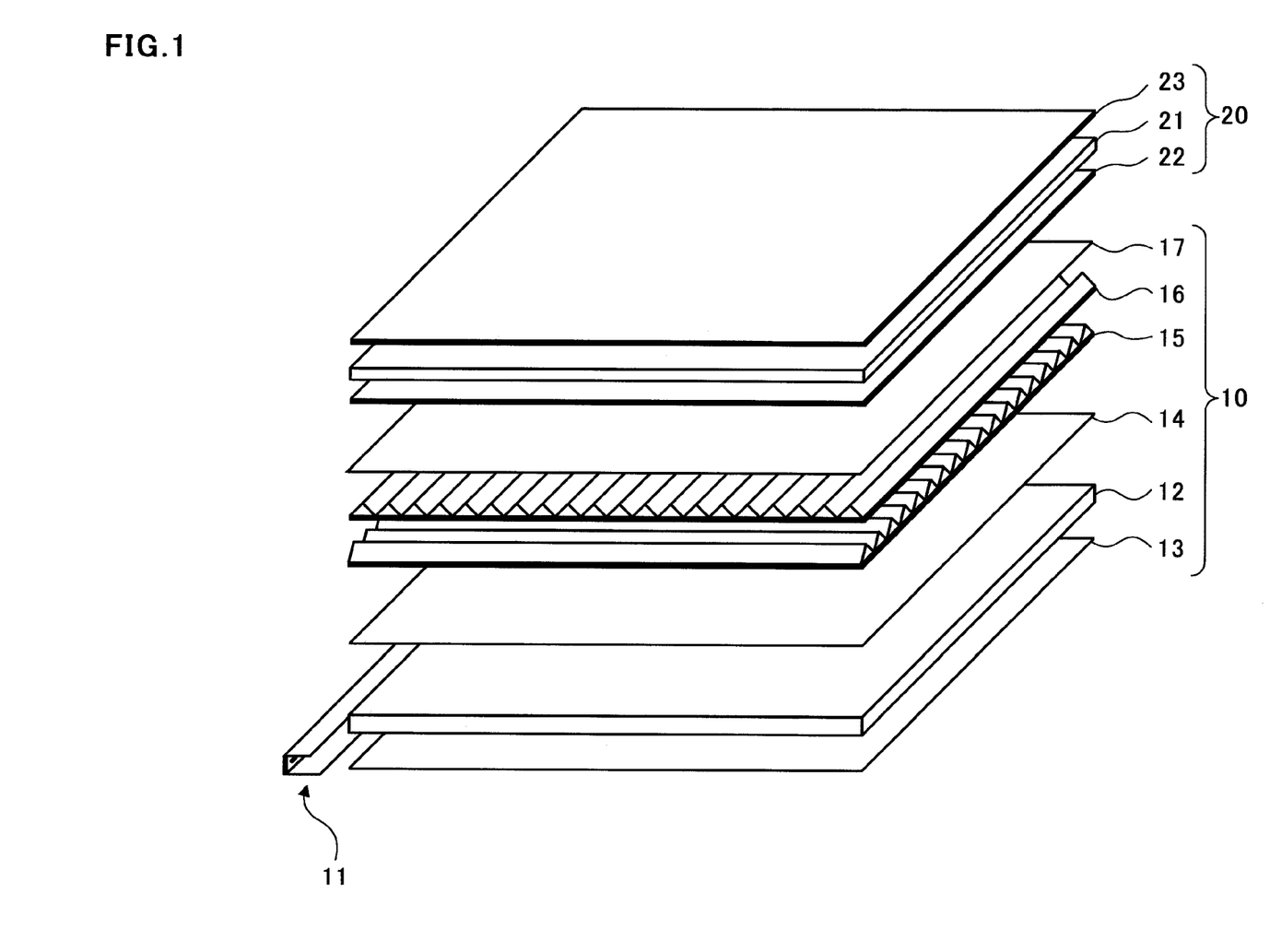
FIG. 1 is a view showing an entire configuration of a liquid crystal display device to which an exemplary embodiment is applied.

FIG. 1 is a view showing an entire configuration of a liquid crystal display device to which an exemplary embodiment is applied. The liquid crystal display device includes a liquid crystal display module 20, and a backlight system 10 disposed on a rear side of the liquid crystal display module 20 (a lower side in FIG. 1). Incidentally, the backlight system 10 with a so-called side-light type is used in the present exemplary embodiment.

The backlight system 10 includes a light source device 11, a light guide plate 12, a reflecting sheet 13, a diffusing sheet 14, prism sheets 15 and 16, and a diffusing sheet 17.

The light source device 11 is arranged so as to face one side (namely, the long side) of the light guide plate 12. In the present exemplary embodiment, the light source device 11 is configured of an array of plural LEDs that each emit any of red (R), green (G) and blue (B) light. Incidentally, the configuration of the light source device 11 will be described in detail later.

The light guide plate 12 for use as an output member has a rectangular shape corresponding to a liquid crystal panel 21, and is made of a material with excellent light transmission properties, such as an acrylic resin. Concavities and convexities or reflecting dots made of white ink or the like (neither of which is shown in the figure) are formed on a surface of the light guide plate 12 opposite to a surface thereof facing a liquid crystal display module 20. Incidentally, besides the light guide plate 12 mentioned above, for example, a metallic plate or the like having a reflecting surface formed thereon may be used as the output member.

The reflecting sheet 13 is arranged in close contact with the surface of the light guide plate 12 having the dots formed thereon. The reflecting sheet 13 is formed of a film of a white color or a metallic luster.

The diffusing sheet 14 is arranged in close contact with the surface of the light guide plate 12 opposite to the surface facing the reflecting sheet 13. The diffusing sheet 14 is a film made of a laminate of optical films, for example.

The prism sheets 15 and 16 are disposed on the diffusing sheet 14 (or on the side thereof close to the liquid crystal display module 20). The prism sheets 15 and 16 are formed of diffraction grating films orthogonal to each other.

The diffusing sheet 17 is arranged in contact with the upper surface of the prism sheet 16 to protect the prism sheet 16. The diffusing sheet 17 is made of, for example, a laminate of optical films, similarly to the diffusing sheet 14.

On the other hand, the liquid crystal display module 20 includes a liquid crystal panel 21 as a display panel composed of two glass substrates with liquid crystal in between, and polarization plates 22 and 23 for restricting the oscillation of optical wave to a given direction. Here, each of the polarization plates 22 and 23 are stacked on each glass substrate of the liquid crystal panel 21. Further, to the liquid crystal display module 20, peripheral members such as an LSI (large scale integration) for driving are equipped.

The liquid crystal panel 21 includes various structural components not shown in the figure. For example, the two glass substrates have display electrodes, active elements such as a thin film transistor (TFT: thin film transistor), liquid crystal, a spacer, sealant, an orientation film, a common electrode, a protective film, a color filter, and the like which are not shown in the figure.

Incidentally, the structural unit of the backlight system 10 may be selected in an arbitrary way. For example, the unit including only the light source device 11 and the light guide plate 12 may be called as a "backlight system (backlight)" and distributed as a service unit not including the reflecting sheet 13, the diffusing sheets 14 and 17, the prism sheets 15 and 16 and the like.

A description will be given with regard to operation of the backlight system 10.

When the red (R), green (G) and blue (B) LEDs of the light source device 11 are turned on, beams of red (R), green (G) and blue (B) light emitted from the LEDs are incident on the light guide plate 12 from one side thereof. Then, the light guide plate 12 guides the light emitted from the light source device 11 into the light guide plate 12 throughout the entire area of the light guide plate 12, using total reflection by a material (e.g., the acrylic resin) of the light guide plate 12. At this time, the light striking the concavities and convexities or the reflecting dots formed on the back side of the light guide plate 12 changes its course, and the light having an angle less than an angle of the total reflection goes out of the light guide plate 12 through the front surface thereof (or the surface thereof facing the diffusing sheet 14). Also, the light not striking the reflecting dots of the light guide plate 12 is reflected by the reflecting sheet 13 and is further reflected by the surface of the light guide plate 12. By repeating this, the light is outputted from the light guide plate 12 through the front surface thereof, substantially uniformly throughout the entire area thereof. Meanwhile, the beams of red (R), green (G) and blue (B) light are mixed to form white light, which is then outputted.

The light outputted from the front surface of the light guide plate 12 in this manner is scattered and diffused at the diffusing sheet 14 and is outputted in more uniform manner. Then, the light outputted from the diffusing sheet 14 is focused forward, or equivalently, toward the diffusing sheet 17 (or the liquid crystal display module 20), at the prism sheets 15 and 16. Then, the light outputted from the prism sheet 16 is further scattered and diffused by the diffusing sheet 17, and is outputted to the liquid crystal display module 20. Therefore, the liquid crystal display module 20 receives an entry of light that is whitened by sufficient color mixture, is uniform in intensity throughout the entire area, and is improved in brightness throughout the entire area.

Figures 2A, 2B:
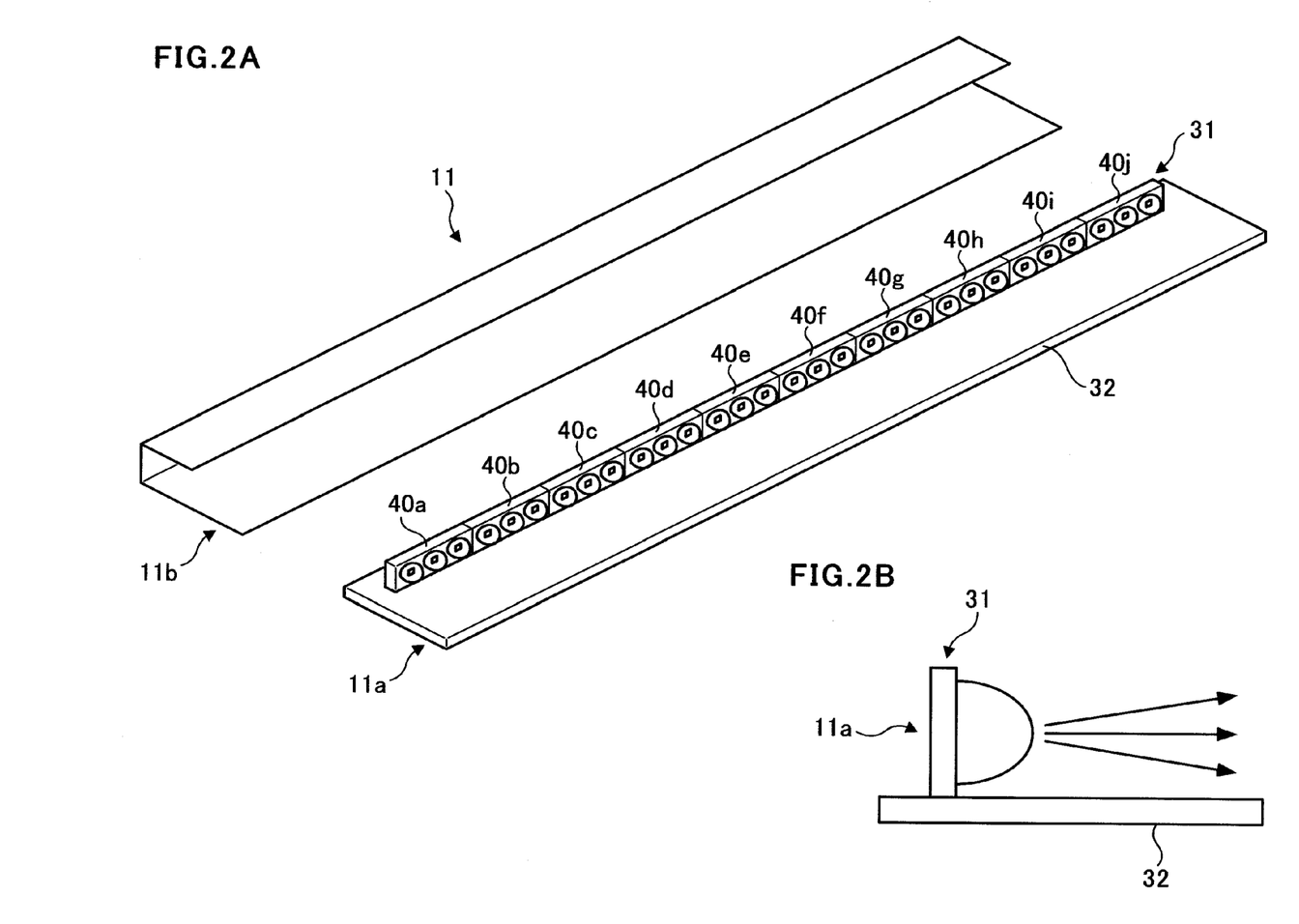
FIG. 2A is a perspective view of the light source device for use in the backlight system shown in FIG. 1, as disassembled into principal structural components.
FIG. 2B shows a side view of the light-emitting device.

FIG. 2A is a perspective view of the light source device 11 for use in the backlight system 10 shown in FIG. 1, as disassembled into principal structural components. The light source device 11 includes a light-emitting device 11a having plural LEDs (hereinafter called a group of LEDs not shown in the figure), and a supporting member 11b that supports the light-emitting device 11a.

Here, the light-emitting device 11a includes a light-emitting unit 31 having the group of LEDs (not shown in the figure), and a wiring board 32 having an electric current path through which electric power is supplied to the group of LEDs of the light-emitting unit 31, and a heat radiation path through which heat produced by the group of LEDs in accordance with the power supply escapes. Incidentally, the group of LEDs that constitutes the light-emitting unit 31 includes plural red LEDs, plural green LEDs, and plural blue LEDs, as will be described later.

Of these, the light-emitting unit 31 has an array of ten light-emitting modules 40 (specifically, 40a to 40j) arranged in a line. Also, the wiring board 32 is formed of, for example, a printed wiring board having a rectangular shape, and the ten light-emitting modules 40a to 40j are arranged in a straight line and mounted in the longitudinal direction of one wiring board 32.

On the other hand, the supporting member 11b has a concavely bent structure in order to hold the light-emitting device 11a by fitting it therein. The supporting member 11b is made of a metallic plate such as aluminum or stainless steel.

FIG. 2B shows a side view of the light-emitting device 11a. In the present exemplary embodiment, the light-emitting unit 31, that is, the light-emitting modules 40, mounted on the wiring board 32, outputs light in arrow directions, that is, a direction along the surface of the wiring board 32.

Figure 3A:
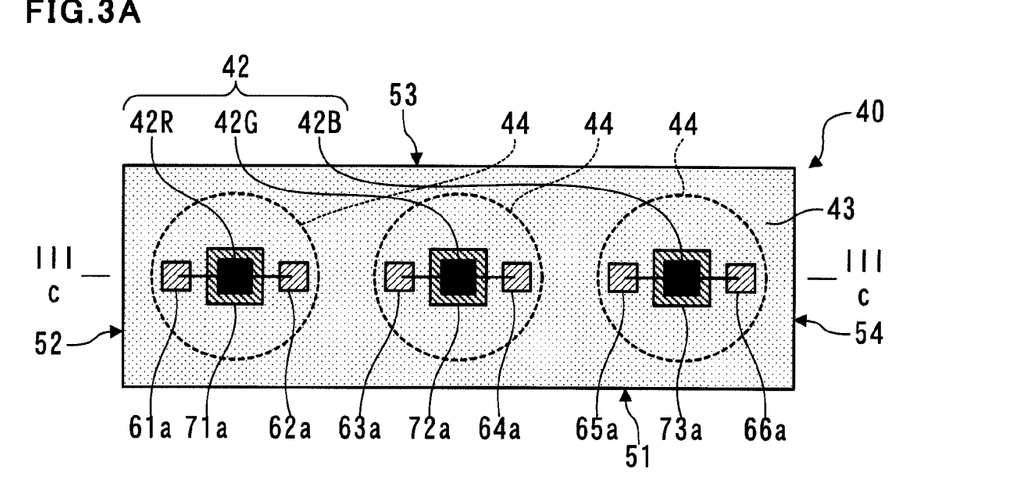
FIGS. 3A to 3C are views for explaining the light-emitting modules that constitute the light-emitting unit.
Figure 3B:
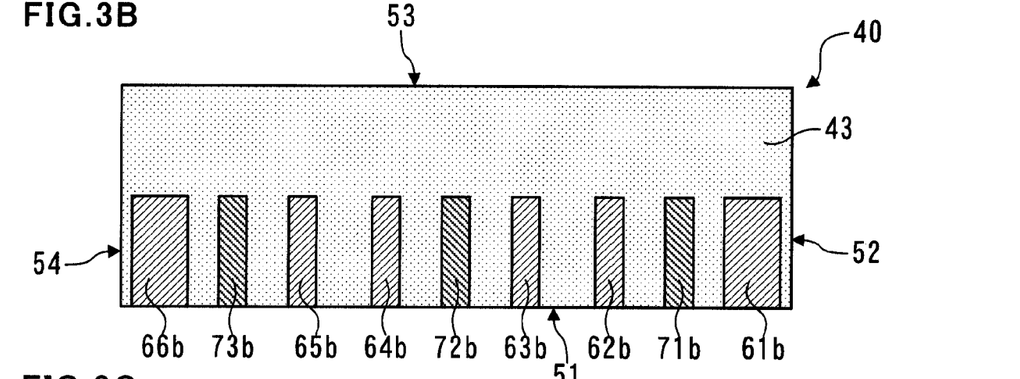
Figure 3C:
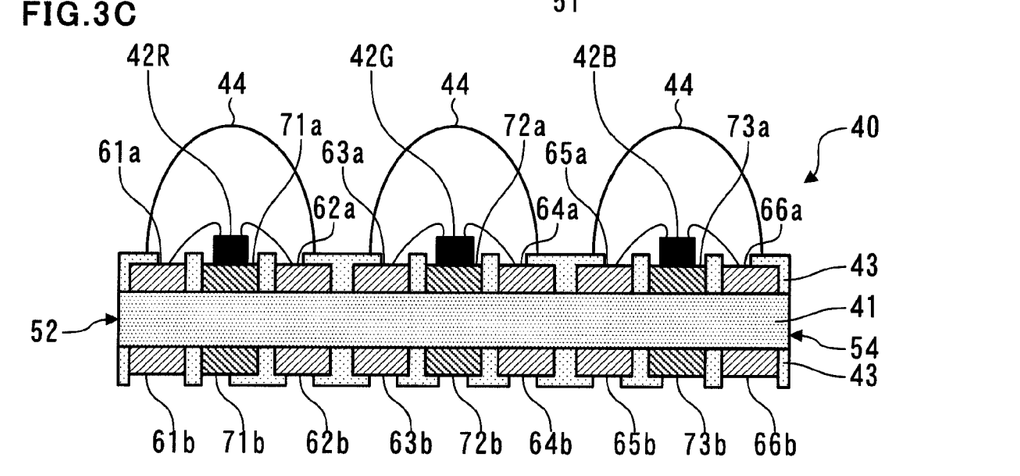

FIGS. 3A to 3C are views for explaining the light-emitting modules 40 that constitute the light-emitting unit 31. Here, FIG. 3A is a front view of the light-emitting module 40 as viewed from the light guide plate 12 shown in FIG. 1; FIG. 3B is a rear view of the light-emitting module 40; and FIG. 3C is a sectional view taken along the line IIIc-IIIc of FIG. 3A. Incidentally, all the light-emitting modules 40a to 40j have the same configuration.

The light-emitting module 40 includes a mounting substrate 41 as a board-shaped substrate having a rectangular shape, and three LEDs 42 as light-emitting elements mounted in an array on one surface of the mounting substrate 41. Also, the light-emitting module 40 further includes resist films 43 formed on one and the other surfaces of the mounting substrate 41, and three lenses 44 that cover the three LEDs 42 disposed on the one surface of the mounting substrate 41, respectively. Here, the three LEDs 42 are a red LED 42R emitting red light, a green LED 42G emitting green light, and a blue LED 42B emitting blue light, arranged in this order from the left side of FIGS. 3A to 3C.

On the one surface of the mounting substrate 41 on which the red LED 42R, the green LED 42G and the blue LED 42B are mounted, there are provided a first power supply pad 61a, a die pad 71a and a second power supply pad 62a for the red LED, a first power supply pad 63a, a die pad 72a and a second power supply pad 64a for the green LED, and a first power supply pad 65a, a die pad 73a and a second power supply pad 66a for the blue LED, arranged in this order from the left side of FIG. 3A. Incidentally, these pads are exposures of a metal layer formed on the mounting substrate 41 which are not coated with the resist film 43. Then, the red LED 42R is mounted on the die pad 71a for the red LED; the green LED 42G, to the die pad 72a for the green LED; and the blue LED 42B, to the die pad 73a for the blue LED. Also, the red LED 42R mounted on the die pad 71a for the red LED is electrically connected by a wire to the first power supply pad 61a and the second power supply pad 62a for the red LED; the green LED 42G mounted on the die pad 72a for the green LED, connected by a wire to the first power supply pad 63a and the second power supply pad 64a for the green LED; and the blue LED 42B mounted on the die pad 73a for the blue LED, connected by a wire to the first power supply pad 65a and the second power supply pad 66a for the blue LED.

On the other hand, on the other surface of the mounting substrate 41, there are provided a first power receiving pad 61b, a heat radiation pad 71b and a second power receiving pad 62b for the red LED, a first power receiving pad 63b, a heat radiation pad 72b and a second power receiving pad 64b for the green LED, and a first power receiving pad 65b, a heat radiation pad 73b and a second power receiving pad 66b for the blue LED, arranged in this order from the right side of the FIG. 3B. Incidentally, these pads are also exposures of the metal layer formed on the mounting substrate 41 which are not coated with the resist film 43. The first power receiving pad 61b for the red LED and the second power receiving pad 66b for the blue LED disposed on both ends of the mounting substrate 41 in the longitudinal direction thereof are greater in width than the heat radiation pad 71b and the second power receiving pad 62b for the red LED, the first power receiving pad 63b, the heat radiation pad 72b and the second power receiving pad 64b for the green LED, and the first power receiving pad 65b and the heat radiation pad 73b for the blue LED, disposed between the first power receiving pad 61b for the red LED and the second power receiving pad 66b for the blue LED.

Then, there are provided electrical connections between the first power supply pad 61a and the first power receiving pad 61b for the red LED, between the second power supply pad 62a and the second power receiving pad 62b for the red LED, between the first power supply pad 63a and the first power receiving pad 63b for the green LED, between the second power supply pad 64a and the second power receiving pad 64b for the green LED, between the first power supply pad 65a and the first power receiving pad 65b for the blue LED, and between the second power supply pad 66a and the second power receiving pad 66b for the blue LED, using metal through-holes (not shown in the figure). Also, there are provided thermal connections between the die pad 71a and the heat radiation pad 71b for the red LED, between the die pad 72a and the heat radiation pad 72b for the green LED, and between the die pad 73a and the heat radiation pad 73b for the blue LED, using metal through-holes (not shown in the figure). Incidentally, the metal through-holes may be filled with metal or be plated on hole walls.

Also, the mounting substrate 41 has four sides, specifically, a first side 51, a second side 52, a third side 53 and a fourth side 54, formed thereon, besides the front surface having the lenses 44 and the like formed thereon and the back surface having the power supply pads and power receiving pads for red, green and blue LEDs formed thereon. Of these sides, the first side 51 that forms one side along the longitudinal direction of the mounting substrate 41 is a part that is brought into contact with the wiring board 32 when the light-emitting device 11a shown in FIGS. 2A and 2B is assembled. The flatness of the first side 51 that forms the contact side is set higher than that of the other second, third and fourth sides 52, 53 and 54 that form the non-contact sides.

Figure 4A:
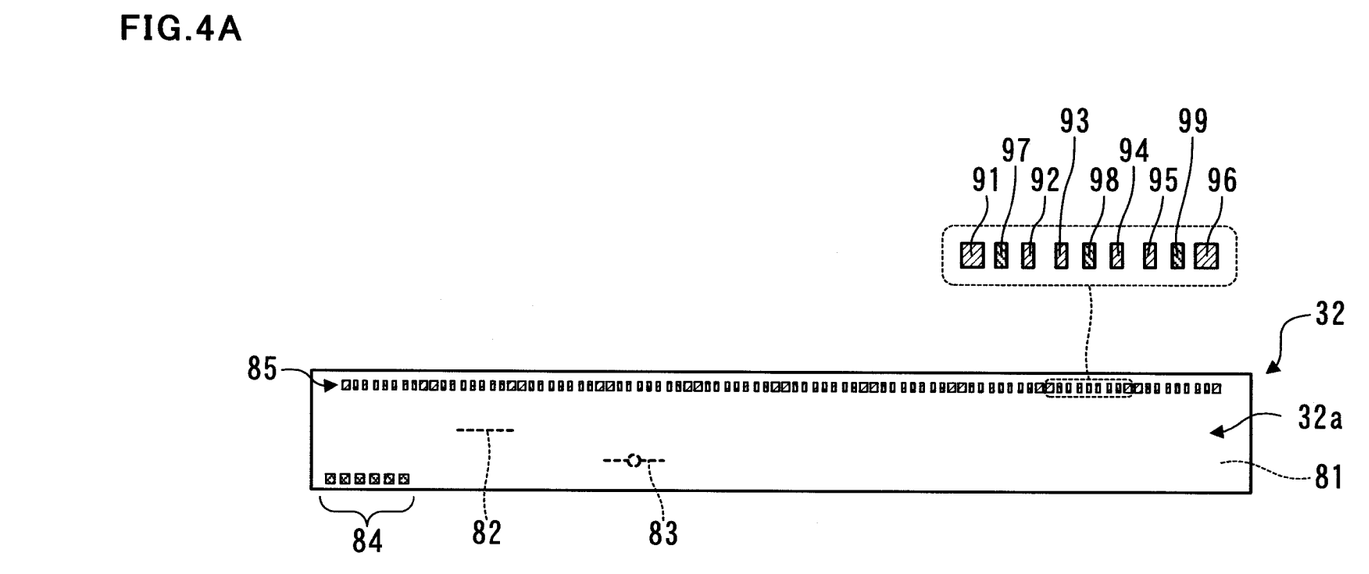
FIGS. 4A and 4B are views for explaining the wiring board that forms the light-emitting device with the light-emitting unit.
Figure 4B:
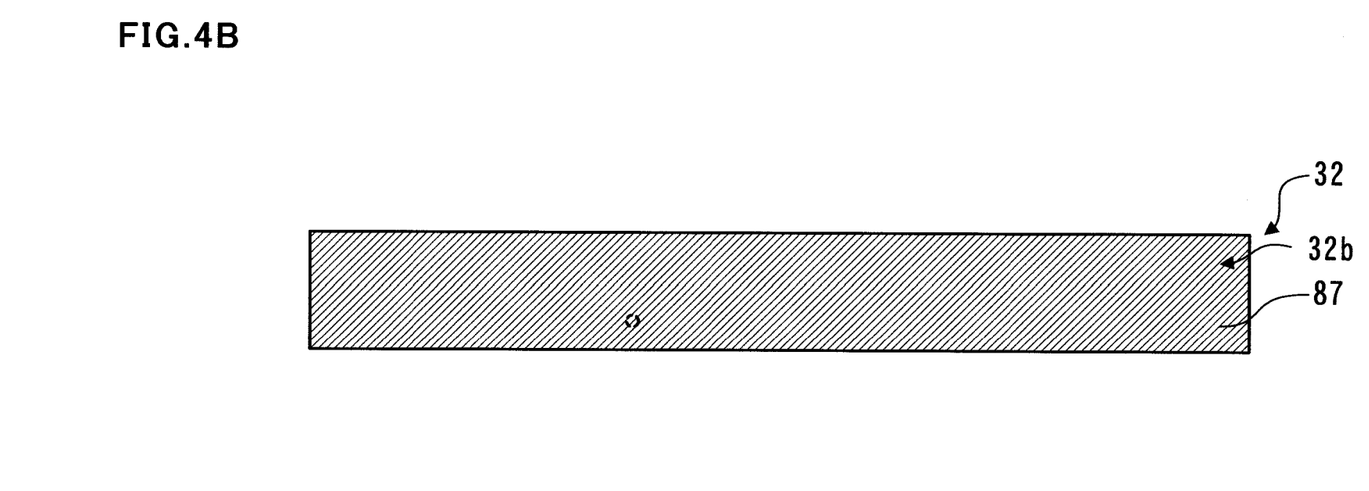

FIGS. 4A and 4B are views for explaining the wiring board 32 that forms the light-emitting device 11a with the light-emitting unit 31. Here, FIG. 4A is a front view showing a mounting surface of the wiring board 32 for mounting the light-emitting modules 40 (or the light-emitting unit 31), and FIG. 4B is a rear view showing a surface of the wiring board 32 opposite to the mounting surface thereof for mounting the light-emitting modules 40. Incidentally, hereinafter, the mounting surface of the wiring board 32 for mounting the light-emitting modules 40 will be called as a top surface 32*a*, and the opposite surface will be called as a back surface 32*b*.

The wiring board 32 includes a base 81 made of an insulator, an electric path 82 and a heat radiation path 83 made of an electrical conductor, and a resist layer formed on a top surface of the wiring board 32.

The base 81 is made of, for example, a glass cloth-based epoxy resin and has a rectangular shape.

Also, the top surface 32*a* of the wiring board 32 has a group of power receiving electrodes 84 and a group of pads 85 formed thereon. Incidentally, the group of the power receiving electrodes 84 and the group of the pads 85 are exposures of a metal layer formed on the top surface 32*a* of the wiring board 32 which is not coated with the resist layer.

Of these components, the group of the power receiving electrodes 84 is collectively arranged at one end of the wiring board 32 in the longitudinal direction thereof. The group of the power receiving electrodes 84 has the function of receiving external electric power to turn on the LEDs 42 provided in the light-emitting module 40 shown in FIGS. 3A to 3C. Also, the group of the pads 85 is arranged, in the longitudinal direction of the wiring board 32, at positions close to one end portion of the wiring board 32 in a shorter direction thereof. The group of the pads 85 has the function of passing the electric power to the LEDs 42 provided in the light-emitting modules 40 and also receiving heat produced by the LEDs 42, when the light-emitting modules 40 are mounted on the wiring board 32.

Here, the group of the pads 85 is formed of ten sets each consisting of a first pad 91 and a second pad 92 for the red LED, a first pad 93 and a second pad 94 for the green LED, a first pad 95 and a second pad 96 for the blue LED, a heat receiving pad 97 for the red LED, a heat receiving pad 98 for the green LED, and a heat receiving pad 99 for the blue LED, which are arranged in the longitudinal direction of the wiring board 32. In each set, the first pad 91, the heat receiving pad 97 and the second pad 92 for the red LED, the first pad 93, the heat receiving pad 98 and the second pad 94 for the green LED, and the first pad 95, the heat receiving pad 99 and the second pad 96 for the blue LED are arranged in this order from the left of the FIG. 4A. Then, in each set, the first pad 91 for the red LED and the second pad 96 for the blue LED disposed on both ends of the set in the longitudinal direction thereof are greater in width than the heat receiving pad 97 and the second pad 92 for the red LED, the first pad 93, the heat receiving pad 98 and the second pad 94 for the green LED, and the first pad 95 and the heat receiving pad 99 for the blue LED disposed between the first pad 91 for the red LED and the second pad 96 for the blue LED.

On the other hand, the resist layer is not formed on the back surface 32*b* of the wiring board 32, and a radiator 87 made of a metal layer formed on the back surface 32*b* of the wiring board 32 is exposed.

Here, the first pad 91 and the second pad 92 for the red LED, the first pad 93 and the second pad 94 for the green LED, and the first pad 95 and the second pad 96 for the blue LED, which are disposed on the top surface 32*a* of the wiring board 32, are electrically connected through the electric path 82 to the electrodes that form the group of the power receiving electrodes 84. Also, the heat receiving pad 97 for the red LED, the heat receiving pad 98 for the green LED and the heat receiving pad 99 for the blue LED, which are disposed on the top surface 32*a* of the wiring board 32, are thermally connected to the radiator 87 disposed on the back surface 32*b*, through the electric path 82 and through metal through-holes which penetrate the top and back surfaces of the wiring board 32 or through metal bumps. Incidentally, the radiator 87 disposed on the back surface 32*b* of the wiring board 32 is brought into contact with the supporting member 11*b*, when the light-emitting device 11*a* configured by mounting the light-emitting unit 31 thereto is attached to the supporting member 11*b* made of metal.

A description will be given with regard to a method for manufacturing the light-emitting module 40 and then with regard to a method for manufacturing the light-emitting device 11*a*.

Figure 5:
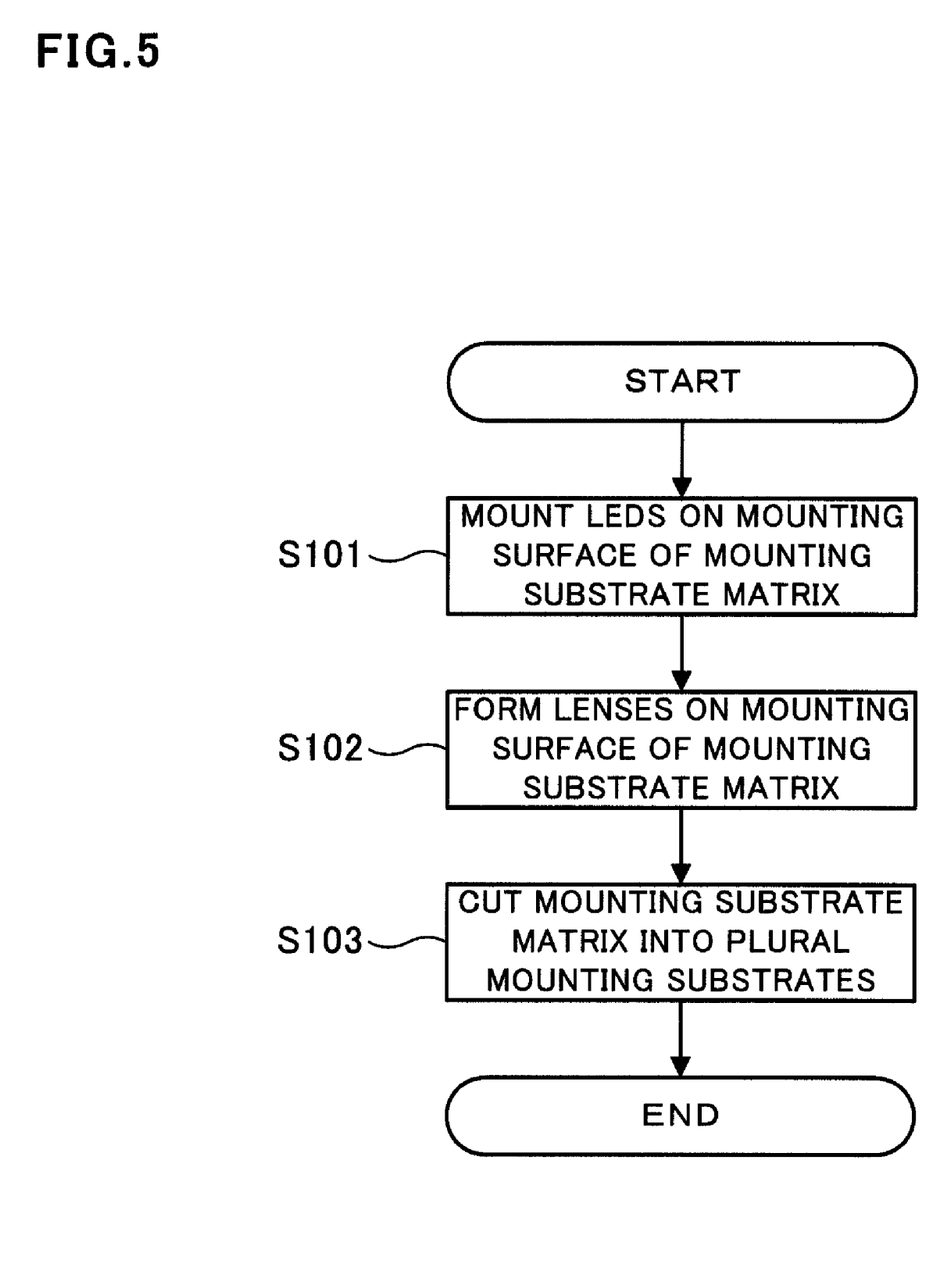
FIG. 5 is a flowchart for explaining a procedure for manufacturing the light-emitting module.

FIG. 5 is a flowchart for explaining a procedure for manufacturing the light-emitting module 40.

The manufacture of the light-emitting module 40 involves a pre-process in which a mounting substrate matrix with a plural mounting substrates 41 arranged therein is manufactured. The mounting substrates 41 may be arranged in any way in the mounting substrate matrix, basically; however, the mounting substrate matrix having the plural mounting substrates 41 arranged horizontally and vertically is generally used. At this time, the mounting substrate matrix is formed of a single printed wiring board, and each of the mounting substrates 41 has wiring pattern previously formed thereon. Also, the resist films 43 are formed on top and back surfaces of the mounting substrate matrix.

Then, the LEDs 42 (namely, the red LED 42R, the green LED 42G and the blue LED 42B) are mounted on a mounting surface of the mounting substrate matrix (step S101). Incidentally, this step involves die bonding and wire bonding of the LEDs 42 to the respective mounting substrates 41. Then, the three lenses 44 are formed on the mounting substrate matrix having the LEDs 42 mounted thereon (step S102). Then, the mounting substrate matrix having the lenses 44 formed thereon is cut into plural mounting substrates 41 (step S103). Here, in the cutting step, a setting is performed in which the flatness of the first side 51 of the four sides (namely, the first side 51, the second side 52, the third side 53 and the fourth side 54 shown in FIGS. 3A to 3C) of the mounting substrate 41 obtained through cutting is the highest. For example, a specific approach involves using a drill or the like to cut the first side 51, while using a dicer or the like to cut the other second, third and fourth sides 52, 53 and 54.

Figure 6:
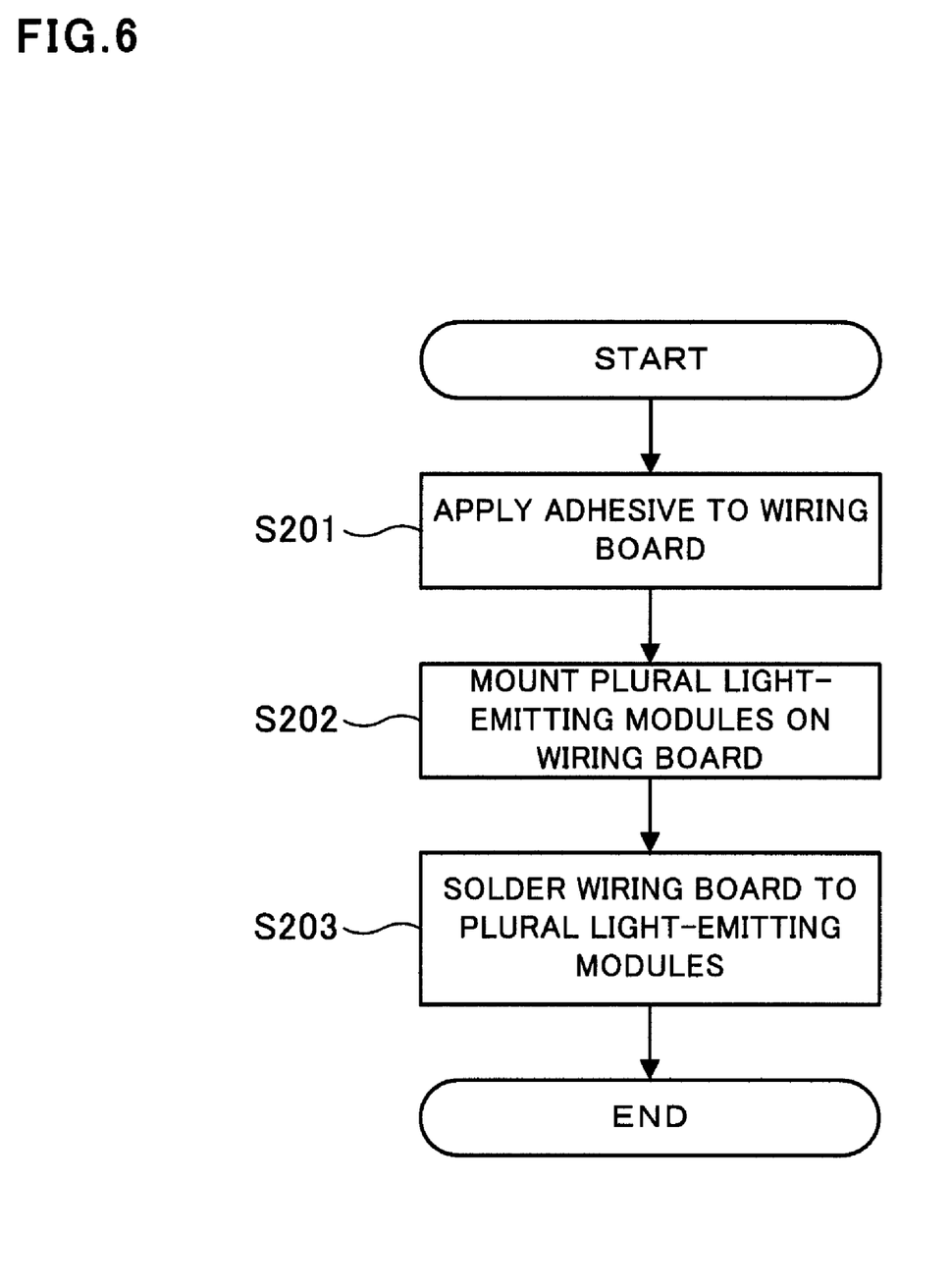
FIG. 6 is a flowchart for explaining a procedure for manufacturing the light-emitting device.

FIG. 6 is a flowchart for explaining a procedure for manufacturing the light-emitting device 11*a*. Incidentally, the plural light-emitting modules 40 that constitute the light-emitting unit 31 of the light-emitting device 11*a* are manufactured by the procedure described above with reference to FIG. 5. Meanwhile, a general manufacturing process for a printed wiring board is used to manufacture the wiring board 32 that constitutes the light-emitting device 11*a*.

First, an adhesive is applied to the top surface 32*a* of the wiring board 32 along the group of the pads 85 (step S201). In this instance, an epoxy-based adhesive is used, and a screen printing or potting approach is adopted for applying the adhesive to the wiring board 32. Then, plural light-emitting modules 40 (ten light-emitting modules 40 as employed in this instance) are mounted on the wiring board having the adhesive applied thereto (step S202). In this step, the light-emitting modules 40 are mounted in an upright position to the wiring board 32 in such a manner that the wiring board 32 is brought into contact with the first side 51 of the mounting substrate 41 of each of the light-emitting modules 40, using an apparatus such as a mounter. As a result, the mounting substrates 41 of the light-emitting modules 40 are arranged substantially perpendicularly to the wiring board 32, as shown in FIG. 2B. Then, the wiring board 32 is soldered to the plural light-emitting modules 40 mounted on the wiring board 32 (step S203). The above procedure leads to the light-emitting device 11a having the light-emitting unit 31 configured by arranging the plural light-emitting modules 40, and the wiring board 32.

Figure 7A:
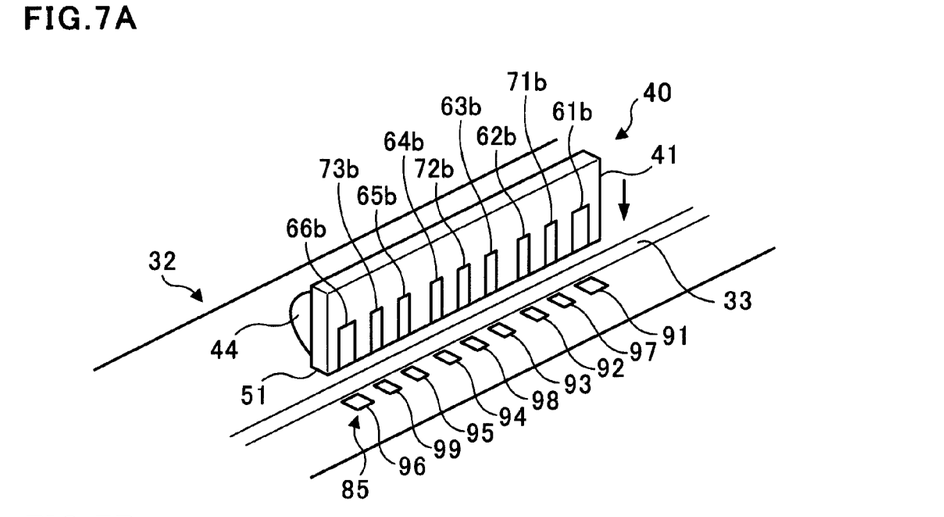
FIGS. 7A to 7C are views for specifically explaining a procedure for mounting the light-emitting module to the wiring board.
Figure 7B:
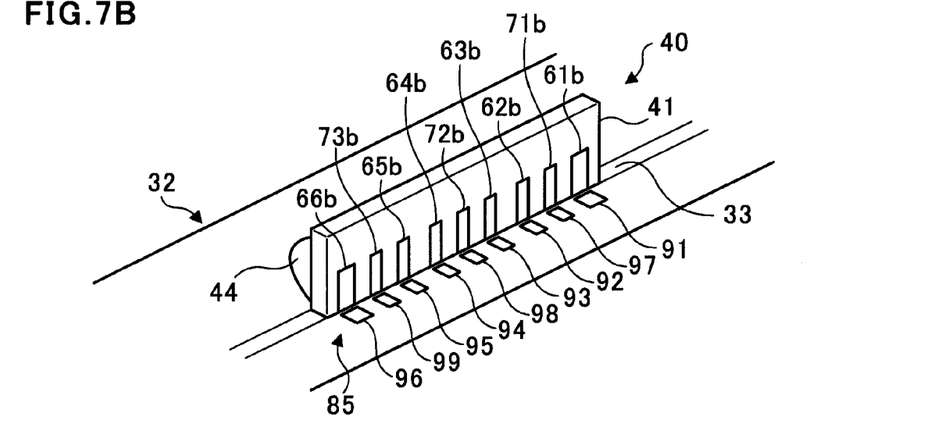
Figure 7C:
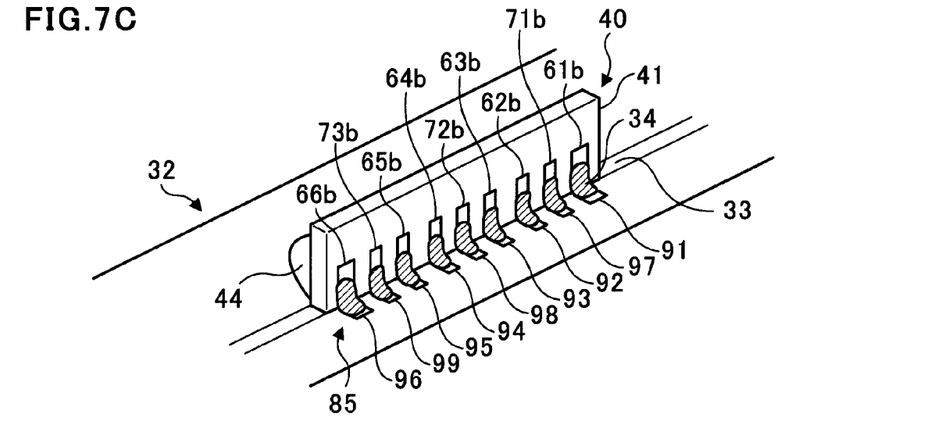

Here, FIGS. 7A to 7C are views for specifically explaining a procedure for mounting the light-emitting module 40 to the wiring board 32.

FIG. 7A shows the light-emitting module 40 and the wiring board 32 in the process of step S201. Specifically, an adhesive 33 is applied to the wiring board 32 along the group of the pads 85. Also, in this situation, the light-emitting module 40 is not mounted on the wiring board 32.

FIG. 7B shows the light-emitting module 40 and the wiring board 32 in the process of step S202. Specifically, the light-emitting module 40 is mounted on the wiring board 32 by the adhesive 33. At this time, mounting is such that the back surface of the light-emitting module 40 faces the group of the pads 85 provided on the wiring board 32. Also, the first power receiving pad 61b, the heat radiation pad 71b and the second power receiving pad 62b for the red LED, the first power receiving pad 63b, the heat radiation pad 72b and the second power receiving pad 64b for the green LED, and the first power receiving pad 65b, the heat radiation pad 73b and the second power receiving pad 66b for the blue LED, all provided on the light-emitting module 40, are disposed so as to face the first pad 91, the heat receiving pad 97 and the second pad 92 for the red LED, the first pad 93, the heat receiving pad 98 and the second pad 94 for the green LED, and the first pad 95, the heat receiving pad 99 and the second pad 96 for the blue LED, all provided on the wiring board 32, respectively.

FIG. 7C shows the light-emitting module 40 and the wiring board 32 in the process of step S203. Specifically, the light-emitting module 40 is joined to the wiring board 32 by the solder 34. Specifically, there are provided electric connections, by the solder 34, between the first pad 91 and the first power receiving pad 61b for the red LED, between the second pad 92 and the second power receiving pad 62b for the red LED, between the first pad 93 and the first power receiving pad 63b for the green LED, between the second pad 94 and the second power receiving pad 64b for the green LED, between the first pad 95 and the first power receiving pad 65b for the blue LED, and between the second pad 96 and the second power receiving pad 66b for the blue LED. Also, there are provided thermal connections, by the solder 34, between the heat receiving pad 97 and the heat radiation pad 71b for the red LED, between the heat receiving pad 98 and the heat radiation pad 72b for the green LED, and between the heat receiving pad 99 and the heat radiation pad 73b for the blue LED.

Here, the solder 34 has the function of fixing the light-emitting module 40 to the wiring board 32 in conjunction with the adhesive 33. In this instance, as mentioned above, the first power receiving pad 61b for the red LED and the second power receiving pad 66b for the blue LED disposed on both ends of the light-emitting module 40 in the longitudinal direction thereof are greater in width than the other pads, and moreover, the first pad 91 for the red LED and the second pad 96 for the blue LED belonging to the group of the pads 85 of the wiring board 32 are greater in width than the other pads. Therefore, soldering is provided over a wider range of area at both ends of the light-emitting module 40 in the longitudinal direction thereof, so that the light-emitting module 40 is mounted on the wiring board 32 with stability.

Also, such soldering leads to the formation of a power supply path for the red LED that supplies power to the red LED 42R, a power supply path for the green LED that supplies power to the green LED 42G, and a power supply path for the blue LED that supplies power to the blue LED 42B, through the wiring board 32 and the mounting substrate 41. Also, this soldering leads to the formation of a heat radiation path for the red LED through which heat escapes from the red LED 42R, a heat radiation path for the green LED through which heat escapes from the green LED 42G, and a heat radiation path for the blue LED through which heat escapes from the blue LED 42B, through the mounting substrate 41 and the wiring board 32. As mentioned above, the heat radiation path 83 provided on the wiring board 32 is connected to the radiator 87 provided on the back surface 32b of the wiring board 32, and the radiator 87 is arranged in contact with the supporting member 11b that constitutes the light source device 11 shown in FIGS. 2A and 2B. Thus, heat transferred from the red LED 42R, the green LED 42G and the blue LED 42B is radiated to the outside through the radiator 87 and the supporting member 11b.

As described above, in the present exemplary embodiment, the plural light-emitting modules 40 are arranged in a line and mounted on the single wiring board 32. In other words, the plural light-emitting modules 40, that is, the plural mounting substrates 41, are used for the configuration of the light-emitting unit 31. This lessens the influence of warpage occurring in the mounting substrate 41, as compared to the use of the single light-emitting module 40, that is, the one mounting substrate 41, for the configuration of the light-emitting unit 31. In other words, the LEDs 42 mounted on each of the mounting substrates 41 are fixed as to be oriented toward the light guide plate 12, and this suppresses the unevenness of light quantity in a liquid crystal display device.

Also, the present exemplary embodiment reduces the number of LEDs 42 mounted on each mounting substrate 41, as compared to a case where the single mounting substrate 41 is used for the configuration of the light-emitting unit 31. This permits reducing the likelihood of the mounting substrate 41 being incapable of being used due to poor light emission from the LEDs 42 or the like, and thus improves the yield of the mounting substrate 41.

Further, in the present exemplary embodiment, for the configuration of the light-emitting device 11a, the mounting substrates 41 having the LEDs 42 mounted thereto are arranged in a line and stands in an upright position, with respect to the wiring board 32. This achieves miniaturization of the device in itself and also achieves cost reduction, as compared to a case where what is called a package type LED is mounted on the wiring board 32 for the configuration of the light-emitting device 11a.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:
1. A display device comprising:
a display panel that displays an image; and
a backlight that is disposed on a back surface of the display panel and emits light from the back surface of the display panel, the backlight including:
an output member that outputs incoming light to the display panel; and
a light source that emits light to the output member from a side of the output member,
the light source including:
a plurality of board-shaped substrates that each have a light-emitting element mounted on a surface thereof; and
a wiring board that is in contact with a side surface of each of the plurality of board-shaped substrates to hold, in an upright position, the plurality of board-shaped substrates which are arranged in a line, and that is arranged so that the each light-emitting element faces the side of the output member while the wiring board is electrically connected to the plurality of board-shaped substrates,
wherein all of electrodes that electrically connect each of the plurality of board-shaped substrates to the wiring board are formed in a row on a back surface of each of the plurality of board-shaped substrate, and
a width of each of two electrodes disposed on both ends among the all of electrodes is greater than a width of each of the plurality of electrodes other than the two electrodes.

2. The display device according to claim 1, wherein
each of the board-shaped substrates has the side surface that is in contact with the wiring board, and other side surfaces that are not in contact with the wiring board, and
the side surface that is in contact with the wiring board is flatter than the other side surfaces.

3. The display device according to claim 1, wherein
each of the board-shaped substrates has a plurality of the light-emitting elements mounted thereon, and
the plurality of light-emitting elements have corresponding lenses formed respectively thereon.

4. The display device according to claim 1, wherein the plurality of board-shaped substrates are thermally connected to the wiring board.

5. A light-emitting device comprising:
a plurality of board-shaped substrates that each have a light-emitting element mounted on a surface thereof; and
a wiring board that is in contact with a side surface of each of the plurality of board-shaped substrates to hold, in an upright position, the plurality of board-shaped substrates which are arranged in a line, and that is arranged so that the each light-emitting element is directed toward a side while the wiring board is electrically connected to the plurality of board-shaped substrates,
wherein the plurality of board-shaped substrates each has a die pad on which the light-emitting element is mounted, and the wiring board has a plurality of a heat receiving pads,
the plurality of board-shaped substrates are thermally connected to the wiring board by connecting the die pads and the heat receiving pads, and
the wiring board has a radiator formed therein to radiate heat transferred from the plurality of board-shaped substrates.

6. The light-emitting device according to claim 5, wherein each of the plurality of board-shaped substrates has a red light emitting element, a green light emitting element and a blue light emitting element mounted thereon as the light-emitting element.

* * * * *